United States Patent
Higgins, Sr. et al.

(10) Patent No.: US 7,244,660 B2
(45) Date of Patent: Jul. 17, 2007

(54) METHOD FOR MANUFACTURING A SEMICONDUCTOR COMPONENT

(75) Inventors: Kelley Kyle Higgins, Sr., Austin, TX (US); Joseph William Wiseman, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 22 days.

(21) Appl. No.: 11/264,194

(22) Filed: Oct. 31, 2005

(65) Prior Publication Data

US 2007/0099430 A1    May 3, 2007

(51) Int. Cl.
    *H01L 21/76* (2006.01)
(52) U.S. Cl. ................ 438/430; 438/523; 257/E21.523
(58) Field of Classification Search ................ 438/430, 438/523
    See application file for complete search history.

(56) References Cited

U.S. PATENT DOCUMENTS

| | | | |
|---|---|---|---|
| 6,004,863 A * | 12/1999 | Jang | 438/427 |
| 6,171,929 B1 * | 1/2001 | Yang et al. | 438/427 |
| 6,268,264 B1 * | 7/2001 | Tseng | 438/424 |
| 6,281,063 B1 * | 8/2001 | Jen et al. | 438/221 |
| 6,734,088 B1 | 5/2004 | Purdy et al. | |
| 6,803,178 B1 | 10/2004 | Subramanian et al. | |
| 2002/0132468 A1 * | 9/2002 | Wong | 438/627 |

* cited by examiner

*Primary Examiner*—W. David Coleman
(74) *Attorney, Agent, or Firm*—Farjami & Farjami LLP

(57) ABSTRACT

A method for manufacturing a semiconductor component using a sacrificial masking structure. A semiconductor device is formed from a semiconductor substrate and a layer of dielectric material is formed over the semiconductor substrate and the semiconductor device. The layer of dielectric material may be formed directly on the semiconductor substrate or spaced apart from the semiconductor substrate by an interlayer. Posts or protrusions having sidewalls are formed from the layer of dielectric material. An electrically insulating material that is preferably different from the layer of dielectric material is formed adjacent the sidewalls of the posts. The electrically insulating material is planarized and the posts are removed to form openings that may expose a portion of the semiconductor device or a portion of the interlayer material. An electrically conductive material is formed in the openings.

9 Claims, 4 Drawing Sheets

METHOD FOR MANUFACTURING A SEMICONDUCTOR COMPONENT

FIELD OF THE INVENTION

This invention relates, in general, to semiconductor components and, more particularly, to masking layers used in semiconductor components.

BACKGROUND OF THE INVENTION

Semiconductor component manufacturers are constantly striving to increase the performance of their products, while decreasing their cost of manufacture. Because semiconductor components such as microprocessors and memory elements can contain millions of transistors or devices, one focus for increasing performance and lowering manufacturing cost has been to shrink the sizes of the transistors making up the semiconductor components. As those skilled in the art are aware, typical semiconductor manufacturing process flows involve a series of steps that include photolithography, etching and material deposition. However, as the semiconductor devices are made smaller, it is becoming increasingly more difficult to use optical lithography because of limitations in the resolution and etch capabilities of photoresist. These problems are further complicated by the poor selectivity of newer photoresists and their inability to withstand plasma etch processes.

Accordingly, it would be advantageous to have a semiconductor device and a method for decreasing the size of the semiconductor device using photolithography. It would be of further advantage for the structure and method to be cost and time efficient and compatible with semiconductor component manufacturing processes.

SUMMARY OF THE INVENTION

The present invention satisfies the foregoing need by providing a method for manufacturing the semiconductor component. In accordance with one embodiment, the present invention includes a method comprising providing a substrate and forming a first layer of dielectric material on the substrate. At least one dielectric post is formed from the first layer of dielectric material. A hard mask material is formed adjacent to the at least one dielectric post, wherein the hard mask material is different from the first layer of dielectric material. A portion of the at least one dielectric post is removed.

In accordance with another embodiment, the present invention includes a method for manufacturing a semiconductor component, comprising forming one or more posts from a layer of dielectric material, wherein each post of the one or more posts has a sidewall. A material is formed adjacent at least one of the one or more posts. A portion of the at least one or more posts is removed.

In accordance with another embodiment, the present invention includes a method for manufacturing a semiconductor component, comprising providing a dielectric material and forming a sacrificial masking structure from the dielectric material. An insulating material is formed adjacent the sacrificial masking structure. The sacrificial masking structure is replaced with an electrically conductive material.

BRIEF DESCRIPTION OF THE DRAWINGS

The present invention will be better understood from a reading of the following detailed description, taken in conjunction with the accompanying drawing figures, in which like reference characters designate like elements, and in which.

DETAILED DESCRIPTION

Generally, the present invention provides a semiconductor component having one or more posts suitable for use as etch stop and disposable masking features and a method for manufacturing the semiconductor component. In accordance with one aspect of the present invention, one or more posts are formed from a layer of dielectric material. A material that is different from the layer of dielectric material is formed adjacent to and on the one or more posts. The material is planarized using the one or more posts as etch stop features. The posts are removed leaving openings or trenches in the layer of dielectric material. Because the posts can be removed, they are also referred to as sacrificial features or disposable masking features or structures. Electrically conductive material is formed in the trenches. The electrically conductive material can serve as an electrical contact, an electrical interconnect, or the like.

Figure 1:
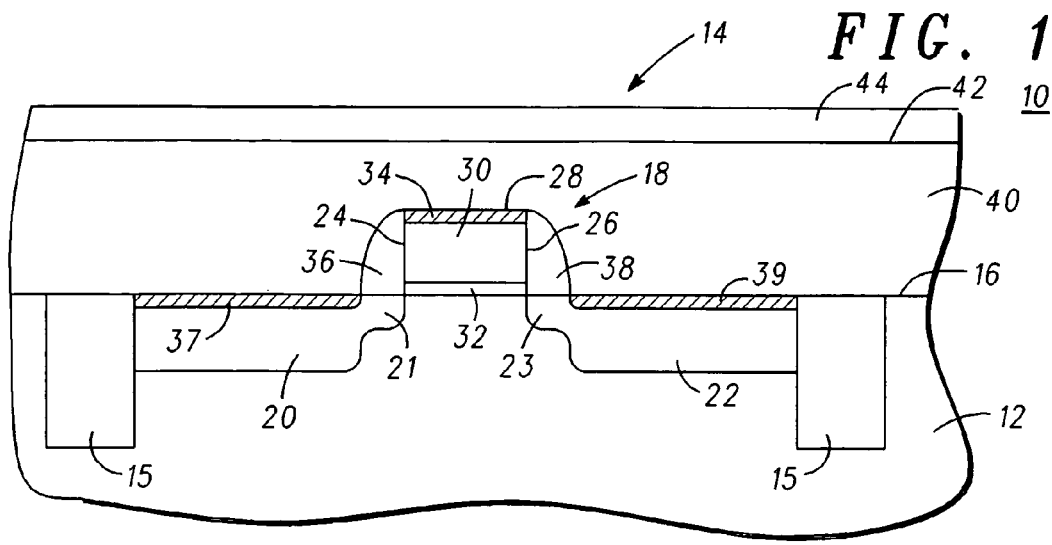
FIG. 1 is a cross-sectional side view of a semiconductor component during manufacture in accordance an embodiment of the present invention.

FIG. 1 is an enlarged cross-sectional side view of a semiconductor component 10 during manufacture in accordance with an embodiment of the present invention. What is shown in FIG. 1 is a portion of a semiconductor substrate 12 from which a semiconductor device 14 has been fabricated. Semiconductor device 14 is electrically isolated from other regions of semiconductor substrate 12 by Shallow Trench Isolation (STI) structures 15. Semiconductor substrate 12 has a major surface 16. By way of example, semiconductor device 14 is an insulated gate field effect transistor that includes a gate structure 18, a source region 20, a source extension region 21, a drain region 22, and a drain extension region 23. Gate structure 18 has sidewalls 24 and 26 and a top surface 28 and comprises a gate electrode 30 disposed on a gate dielectric 32 which is disposed on major surface 16. Spacers 36 and 38 are adjacent sidewalls 24 and 26, respectively. Source region 20 extends into a semiconductor substrate 12 from a portion of major surface 16 that is laterally adjacent spacer 36 and drain region 22 extends into semiconductor substrate 12 from a portion of major surface 16 that is laterally adjacent spacer 38. Source extension region 21 extends into semiconductor substrate 12 from a portion of major surface 16 that is laterally adjacent sidewall 24 and drain extension region 23 extends into semiconductor substrate 12 from a portion of major surface 16 that is laterally adjacent sidewall 26. Although not shown, semiconductor device 14 may have source and drain halo regions. The source and drain regions and the source and drain halo regions may be symmetric or asymmetric, i.e., there may be a source extension region but not a drain extension region or vice versa or there may be a source halo region but not a drain halo region or vice versa. A silicide layer 34 is formed from a portion of gate electrode 30, a silicide layer 37 is formed from a portion of source region 20, and a silicide layer 39 is formed from a portion of drain region 22. Silicide layers 34, 37, and 39 are also referred to as silicided regions. It should be understood that semiconductor device 14 is not limited to being an insulated gate field effect transistor but may be any active element such as, for example, a complementary insulated gate field effect transistor, a bipolar junction transistor, a junction field effect transistor, or the like, as well as any passive element such as, for example, a resistor, a capacitor, an inductor, or the like. Likewise, the material of semiconductor substrate 12 is not a limitation of the present invention. Substrate 12 can be silicon, Semiconductor-On-Insulator (SOI), Semiconductor-On-Sapphire (SOS), silicon germanium, germanium, an epitaxial layer of silicon formed on a silicon substrate, or the like. In addition, semiconductor substrate 12 may be comprised of compound semiconductor materials such as gallium-arsenide, indium-phosphide, or the like. Techniques for manufacturing semiconductor devices such as insulated gate field effect transistor 14 are known to those skilled in the art.

A dielectric material 40 having a surface 42 and a thickness ranging from approximately 4,000 Angstroms (Å) to approximately 10,000 Å is formed on semiconductor substrate 12, semiconductor device 14, and STI isolation structures 15. Suitable materials for dielectric layer 40 include high dielectric constant (high κ) inorganic dielectric materials such as, for example, silicon dioxide, silicon nitride, or the like; organic high κ dielectric materials such as, for example, hydrogenated oxidized silicon carbon material or the like; organic low dielectric constant (low κ) dielectric materials such as, for example, polyimide, spin-on polymers, poly(arylene ether) (PAE), parylene, xerogel, fluorinated aromatic ether (FLARE), fluorinated polyimide (FPI), dense SiLK, porous SiLK (p-SiLK), polytetrafluoroethylene, benzocyclobutene (BCB) or the like; and inorganic low κ dielectric materials such as, for example, hydrogen silsesquioxane (HSQ), methyl silsesquioxane (MSQ), fluorinated glass, NANOGLASS, or the like. It should be understood that the type of dielectric material for dielectric layer 40 is not a limitation of the present invention and that other organic and inorganic dielectric materials may be used. Similarly, the method for forming dielectric layer 40 is not a limitation of the present invention. For example, insulating layer 40 may be formed using spin-on coating, Chemical Vapor Deposition (CVD), Plasma Enhanced Chemical Vapor Deposition (PECVD), or Physical Vapor Deposition (PVD).

Dielectric layer 40 is planarized and a layer of photoresist 44 is formed thereon. Preferably, the photoresist of photoresist layer 44 is a negative tone photoresist. An advantage of using a negative tone photoresist is that it enables imaging of contact posts instead of contact holes.

Figure 2:
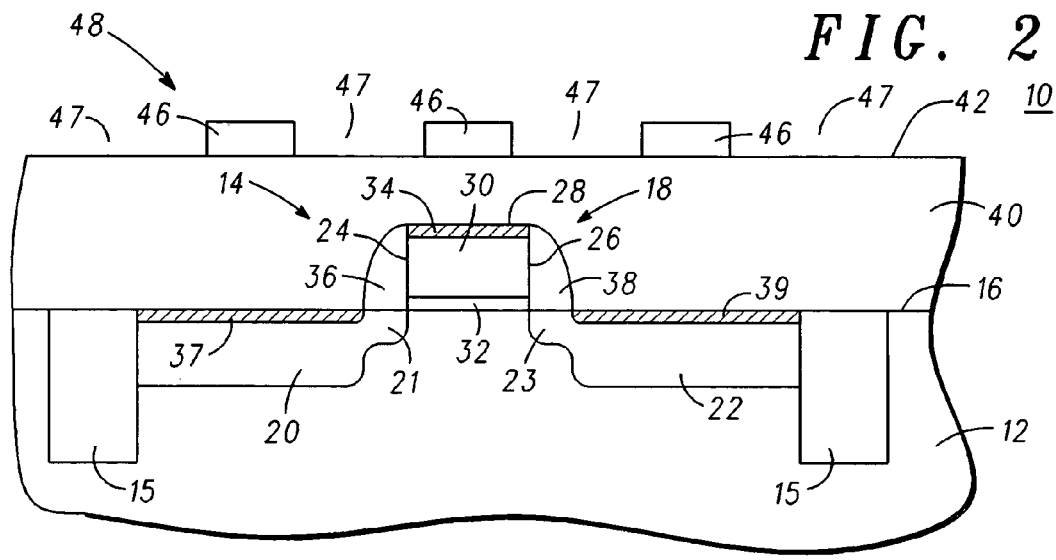
FIG. 2 is a cross-sectional side view of the semiconductor component of FIG. 1 at a later stage of manufacture.

Referring now to FIG. 2, layer of photoresist 44 is exposed to Ultraviolet (UV) light and developed. For a negative tone photoresist, those portions of the photoresist not exposed to the UV light dissolve in a developer and are removed during the development process. Thus, the exposure and development of photoresist layer 44 leaves portions 46 of photoresist layer 44 and openings 47 over dielectric layer 40. Portions 46 and openings 47 cooperate to form an etch mask 48. Portions 46 protect the regions of dielectric layer 40 on which they are formed.

Figure 3:
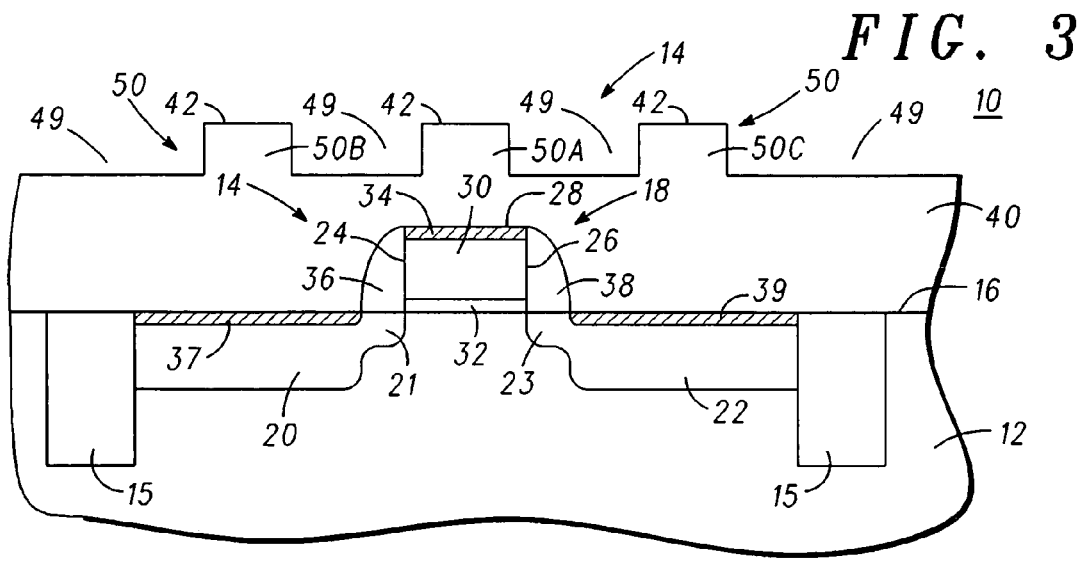
FIG. 3 is a cross-sectional side view of the semiconductor component of FIG. 2 at a later stage of manufacture.

Referring now to FIG. 3, the exposed portions of dielectric layer 40 that are unprotected by portions 46 of etch mask 48 are preferably anisotropically etched using, for example, an anisotropic reactive ion etch. Alternatively, the exposed portions of dielectric layer 44 can be isotropically etched using a wet chemical etch. In accordance with one embodiment, the anisotropic reactive ion etch is a timed etch that forms trenches 49 that extend from approximately 500 Å to approximately 2,000 Å into dielectric layer 40 from surface 42. In other words, the anisotropic etch forms a plurality of posts or pillars 50 from dielectric layer 40, wherein trenches 49 are between or adjacent posts 50. In accordance with one embodiment, a post 50A of plurality of posts 50 is formed over gate structure 18, a post 50B of plurality of posts 50 is formed over source region 20, and a post 50C of plurality of posts 50 is formed over drain region 22. The etch is terminated leaving portions of dielectric layer 40 over silicide layers 34, 37, and 39 which provide electrical isolation between gate structure 18, source region 20, and drain region 22. It should be understood that for the sake of clarity the letters A, B, and C have been appended to the reference character 50 to identify specific posts of the plurality of posts 50.

Figure 4:
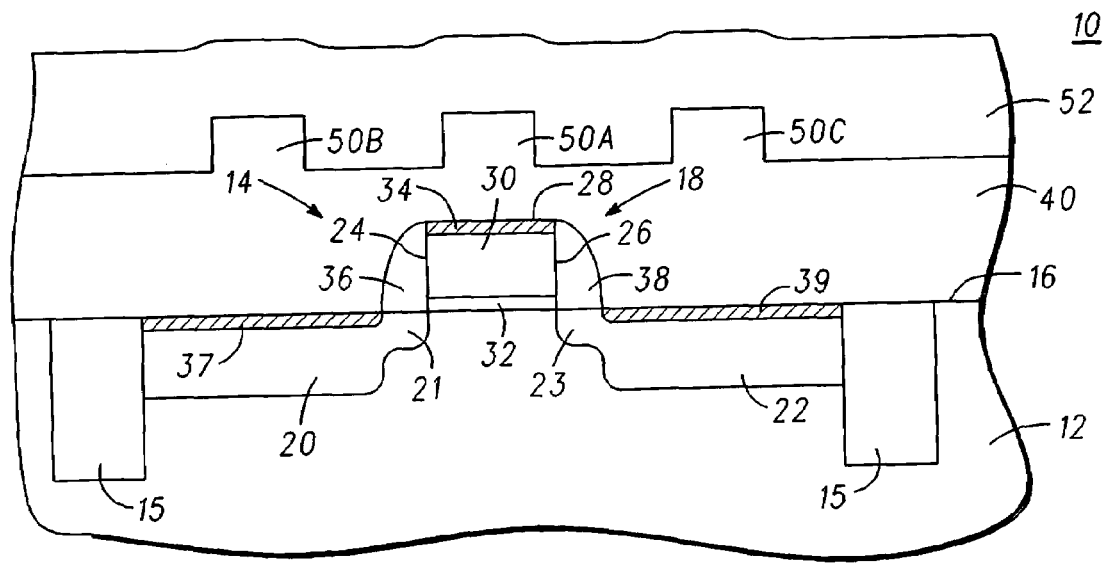
FIG. 4 is a cross-sectional side view of the semiconductor component of FIG. 3 at a later stage of manufacture.

Referring now to FIG. 4, a layer of amorphous silicon 52 is formed on dielectric layer 40, i.e., amorphous silicon layer 52 is formed on posts 50 and either fills or partially fills trenches 49. Amorphous silicon layer 52 serves as a hard mask. Preferably, amorphous silicon layer 52 is thicker than the thickness of dielectric layer 40 that is removed in forming posts 50. Even more preferably, amorphous silicon layer 52 is at least two times thicker than the thickness of the portion of dielectric layer 40 that is removed in forming posts 50. By way of example, the thickness of the portion of amorphous silicon layer 52 over surface 42 ranges from approximately 1,000 Å to approximately 4,000 Å. It should be noted that the type of material of layer 52 is not limited to being amorphous silicon. The material for layer 52 is selected to have a different etch rate than the material of dielectric layer 40. For example, if dielectric layer 40 is silicon dioxide, layer 52 may be silicon nitride. Other suitable materials for layer 52 include tungsten silicon, titanium nitride, or the like. When dielectric layer 40 is a low κ dielectric material, layer 52 may be silicon oxynitride.

Figure 5:
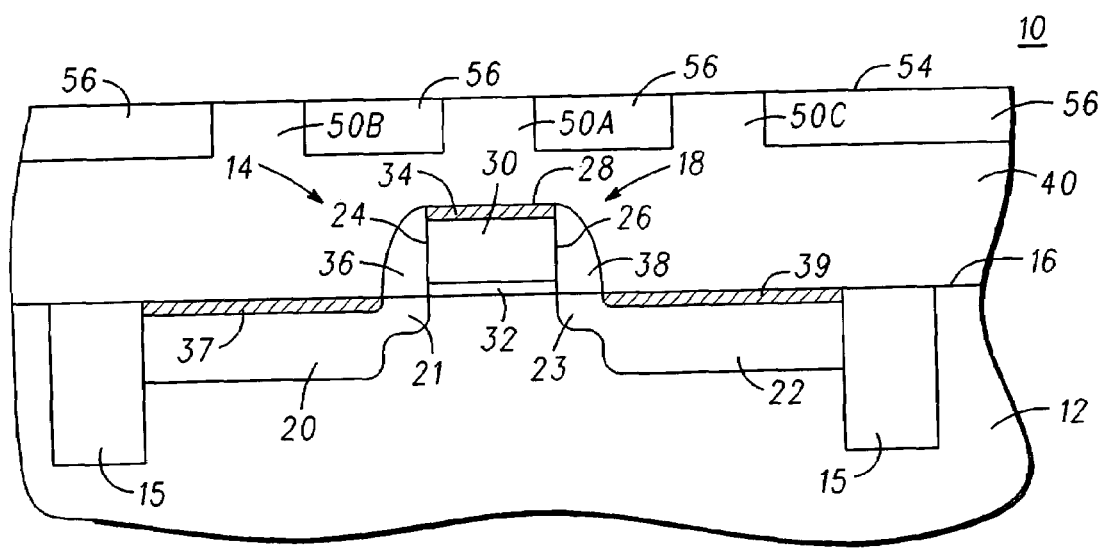
FIG. 5 is a cross-sectional side view of the semiconductor component of FIG. 4 at a later stage of manufacture.

Referring now to FIG. 5, amorphous silicon layer 52 is planarized using, for example, a Chemical Mechanical Polishing (CMP) technique having a high selectivity to dielectric layer 40. Thus, the planarization stops on dielectric layer 40 and forms a planarized surface 54. In particular, the planarization stops on posts 50 that are formed from dielectric layer 40. After planarization, portions 56 of amorphous silicon layer 52 remain in trenches 49. As those skilled in the art are aware, Chemical Mechanical Polishing is also referred to as Chemical Mechanical Planarization. Other suitable planarization techniques include electropolishing, electrochemical polishing, chemical polishing, and chemically enhanced planarization.

Figure 6:
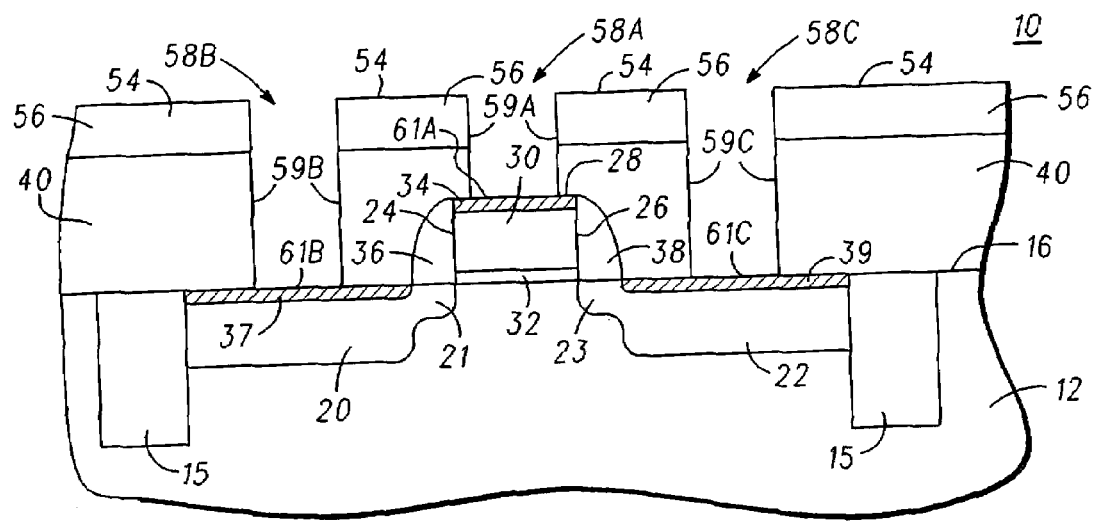
FIG. 6 is a cross-sectional side view of the semiconductor component of FIG. 5 at a later stage of manufacture.

Referring now to FIG. 6, posts 50A, 50B, and 50C are removed using a dry etch such as, for example, a reactive ion etch. Removal of posts 50A, 50B, and 50C forms contact openings 58A, 58B, and 58C that expose silicide layers 34, 37, and 39 of gate electrode 18, source region 20, and drain region 22, respectively. Contact opening 58A has sidewalls 59A and a floor 61A, contact opening 58B has sidewalls 59B and a floor 61B, and contact opening 58C has sidewalls 59C and a floor 61C. In accordance with one embodiment, silicide layers 34, 37, and 39 serve as floors 61A, 61B, and 61C, respectively.

Figure 7:
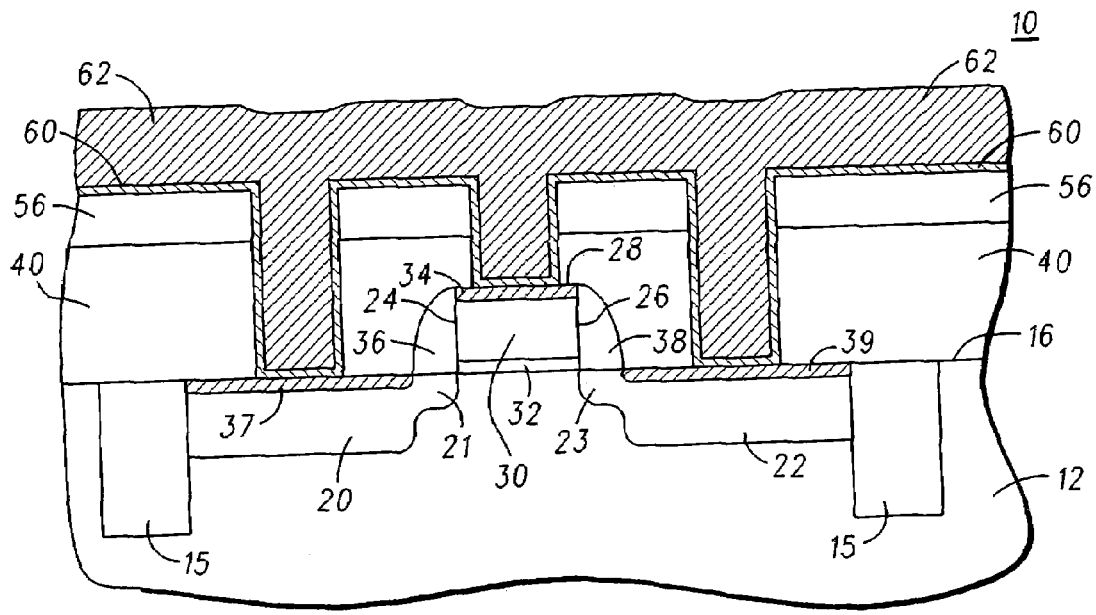
FIG. 7 is a cross-sectional side view of the semiconductor component of FIG. 6 at a later stage of manufacture.

Referring now to FIG. 7, a layer of titanium nitride 60 having a thickness ranging from approximately 200 Å to approximately 350 Å is formed on amorphous silicon layer 56 and on sidewalls 59A, 59B, and 59C of openings 58A, 58B, and 58C, respectively. Titanium nitride layer 60 may be formed using Chemical Vapor Deposition (CVD), Plasma Enhanced Chemical Vapor Deposition (PECVD), sputtering, evaporation, or the like. Preferably, titanium nitride layer 60 is conformally deposited on amorphous silicon layer 56, and on sidewalls 59A, 59B, and 59C to form a barrier-lined opening. Titanium nitride layer 60 serves as a barrier layer to prevent diffusion from a subsequently deposited metal into dielectric layer 40, amorphous silicon layer 56, and semiconductor device 14. In addition, titanium nitride layer 60 provides a low contact resistance to silicide layers 34, 37, and 39. Other suitable materials for barrier layer 60 include titanium (Ti), tantalum (Ta), tantalum nitride (TaN), a combination of tantalum (Ta) and tantalum nitride (TaN), where the tantalum nitride is sandwiched between the tantalum and the surfaces of openings 58A, 58B, and 58C; tungsten (W), tungsten nitride (WN), titanium silicon nitride (TiSiN), and refractory metal compounds such as refractory metal nitrides, refractory metal carbides, or refractory metal borides.

A film or layer 62 of an electrically conductive material such as, for example, tungsten is formed on barrier layer 60 and preferably fills openings 58A, 58B, and 58C, thereby forming a metal-filled barrier-lined opening. Alternatively, layer 62 may be copper.

Figure 8:
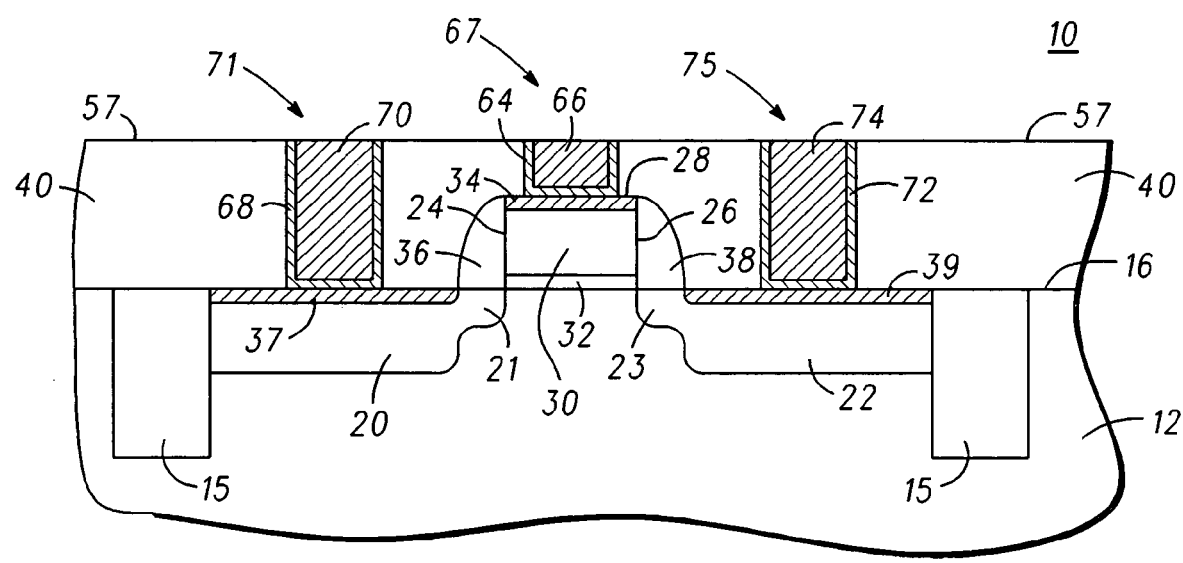
FIG. 8 is a cross-sectional side view of the semiconductor component of FIG. 7 at a later stage of manufacture.

Referring now to FIG. 8, tungsten layer 62 is planarized using, for example, a CMP technique having a high selectivity to dielectric layer 40 to form a planar surface 57. Thus, the planarization removes amorphous silicon layer 56. After planarization, portion 64 of barrier layer 60 and portion 66 of copper film 62 remain in opening 58A to form a contact 67, portion 68 of barrier layer 60 and portion 70 of copper film 62 remain in opening 58B to form a contact 71, and portion 72 of barrier layer 60 and portion 74 of copper film 62 remain in opening 58C to form a contact 75 (openings 58A, 58B, and 58C are shown in FIG. 6). Other suitable planarization techniques include electropolishing, electrochemical polishing, chemical polishing, and chemically enhanced planarization.

By now it should be appreciated that a semiconductor component having posts or protrusions and a method for manufacturing the semiconductor component have been provided. Preferably, the posts are formed by patterning a negative tone photoresist on the dielectric material and removing portions of the dielectric material. However, masking materials such as positive tone photoresist and dielectric materials can also be used for forming the posts or masking structures. An advantage of using a negative tone photoresist is that it enables imaging of contact posts instead of holes. Thus, most of the photoresist is exposed to UV light leaving photoresist over those portions of the dielectric material from which the posts will be formed. This allows for a sharper photoresist pattern definition and the formation of semiconductor components having smaller feature sizes. Because of the sharper photoresist pattern definition, the cost of manufacturing semiconductor components is decreased. What is more, the method can be implemented in a multitude of processing flows including single and dual damascene processing techniques, i.e., trenches and vias can also be formed in accordance with the present invention.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a semiconductor component, comprising:
   providing a dielectric material;
   forming a sacrificial masking structure from the dielectric material;
   forming an insulating material adjacent the sacrificial masking structure; and
   replacing the sacrificial masking structure with an electrically conductive material.

2. The method of claim 1, further including providing a semiconductor material having a silicided region, wherein providing the dielectric material includes providing the dielectric material on the semiconductor material and wherein replacing the sacrificial masking structure includes removing the sacrificial masking structure and exposing the silicided region.

3. The method of claim 1, wherein forming the sacrificial masking structure includes:
   forming a layer of negative tone photoresist on the dielectric material;
   forming at least one opening in the layer of negative tone photoresist, the at least one opening exposing a portion of the dielectric material;
   etching a portion of the exposed portion of the dielectric material to form a contact opening in the dielectric material;
   forming an amorphous silicon layer in the trench; and
   planarizing the amorphous silicon layer.

4. A method for manufacturing a semiconductor component, comprising:
   providing a substrate;
   forming a first layer of dielectric material on the substrate;
   forming at least one dielectric post from the first layer of dielectric material;
   forming a hard mask material adjacent the at least one dielectric post, wherein the hard mask material is different from the first layer of dielectric material;
   removing a portion of the at least one dielectric post, wherein removing the portion of the at least one post includes forming at least one opening in the first layer of dielectric material, the at least one opening having a floor and sidewalls; and
   disposing an electrically conductive material over the floor and sidewalls of the at least one opening.

5. The method of claim 4, wherein disposing the electrically conductive material over the floor and sidewalls of the at least one opening includes:
   forming a barrier layer over the floor and sidewalls of the at least one opening; and
   forming an electrically conductive material over the barrier layer.

6. The method of claim 4, wherein providing the substrate includes providing a semiconductor substrate having a first silicide layer and a second silicide layer and wherein forming the at least one opening includes exposing at least one of the first silicide layer and the second silicide layer.

7. The method of claim 6, further including forming the first silicide layer from a source region and forming the second silicide layer from a drain region, and wherein providing the semiconductor substrate further includes providing a gate structure.

8. A method for manufacturing a semiconductor component, comprising:
   forming one or more posts from a layer of dielectric material, each post of the one or more posts having a sidewall;
   forming a material adjacent at least one of the one or more posts;
   removing a portion of at least one of the one or more posts;
   wherein forming the one or more posts from the layer of dielectric material includes:
   forming an etch mask over a first portion of the layer of dielectric material;
   etching a second portion of the layer of dielectric material, the second portion of the layer of dielectric material unprotected by the etch mask;
   wherein forming the material adjacent the at least one of the one or more posts includes disposing a material selected from the group of materials comprising amorphous silicon, silicon nitride, silicon dioxide, silicon oxynitride, and tungsten silicon;
   wherein said method further includes planarizing the material adjacent the at least one of the one or more posts, removing a portion of the at least one or more posts to form an opening, and forming an electrically conductive material in the opening.

9. The method of claim 8, wherein providing the semiconductor substrate includes providing the semiconductor substrate having a silicided region and wherein removing the portion of the at least one or more posts to form the opening includes exposing the silicided region.

* * * * *